United States Patent
Wang et al.

(10) Patent No.: US 10,564,186 B2
(45) Date of Patent: Feb. 18, 2020

(54) CURRENT SENSE AMPLIFIER ARCHITECTURE AND LEVEL SHIFTER

(71) Applicant: Microchip Technology Incorporated, Chandler, AZ (US)

(72) Inventors: Dong Wang, Chandler, AZ (US); Jim Nolan, Chandler, AZ (US); Kumen Blake, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 216 days.

(21) Appl. No.: 15/712,771

(22) Filed: Sep. 22, 2017

(65) Prior Publication Data
US 2018/0088152 A1 Mar. 29, 2018

Related U.S. Application Data

(60) Provisional application No. 62/399,025, filed on Sep. 23, 2016.

(51) Int. Cl.
*G01R 15/14* (2006.01)
*G01R 1/30* (2006.01)
(Continued)

(52) U.S. Cl.
CPC .......... *G01R 15/146* (2013.01); *G01R 1/30* (2013.01); *H01L 23/60* (2013.01); *H03F 3/2171* (2013.01); *H03F 2200/171* (2013.01)

(58) Field of Classification Search
CPC ... G01R 15/146; H03F 3/45475; H03F 3/393; H03F 3/2171; H01L 23/60
See application file for complete search history.

(56) References Cited

U.S. PATENT DOCUMENTS

| 5,920,264 A | * | 7/1999 | Kim | G06F 1/206 257/E23.08 |
| 7,098,733 B1 | * | 8/2006 | Lokere | H03F 3/211 330/147 |

(Continued)

OTHER PUBLICATIONS

Witte, Johan F. et al., "A Current-Feedback Instrumentation Amplifier with 5 µV Offset for Bidirectional High-Side Current Sensing," IEEE Journal of Solid-State Circuits, vol. 43, No. 12, pp. 2769-2775, Dec. 10, 2008.

(Continued)

*Primary Examiner* — Dominic E Hawkins
(74) *Attorney, Agent, or Firm* — Slayden Grubert Beard PLLC

(57) ABSTRACT

A high side current sensing amplifier architecture is simplified and improved over prior art current sensing amplifier circuits by using chopping only, without requiring auto-zeroing, and by using a simpler (and faster) switched capacitor filter instead of an auto-zeroing integrator filter. Also, VIP (positive DC sense node) is merged with the VDDHV (power supply) node, such that the integrated circuit package requires only a single node (package pin) to accommodate both the VIP and VDDHV connections for the current sensing amplifier circuit, resulting in being able to use a smaller integrated circuit package. A small resistor is coupled between VIP and VDDHV to reduce the offset considerably. A low latency time high voltage level shifter is provided which is essential for precise chopping operation.

14 Claims, 11 Drawing Sheets

(51) Int. Cl.
  *H01L 23/60* (2006.01)
  *H03F 3/217* (2006.01)

(56) References Cited

U.S. PATENT DOCUMENTS

| | | | | |
|---|---|---|---|---|
| 7,535,295 | B1* | 5/2009 | Huijsing | H03F 1/26 |
| | | | | 327/124 |
| 8,099,073 | B1* | 1/2012 | Muller | H04B 1/0483 |
| | | | | 330/9 |
| 8,502,515 | B1* | 8/2013 | Wan | H02M 3/1584 |
| | | | | 323/272 |
| 9,172,332 | B2* | 10/2015 | Tomioka | H03F 3/387 |
| 9,696,352 | B2* | 7/2017 | Brown | G01R 19/25 |
| 9,716,398 | B2* | 7/2017 | Lee | H02J 7/025 |
| 2006/0176108 | A1* | 8/2006 | Huijsing | H03F 1/08 |
| | | | | 330/9 |
| 2006/0176109 | A1* | 8/2006 | Huijsing | H03F 3/005 |
| | | | | 330/9 |
| 2009/0174479 | A1* | 7/2009 | Yan | H03F 1/0216 |
| | | | | 330/252 |
| 2010/0039118 | A1 | 2/2010 | Crozier et al. | 324/538 |
| 2013/0271216 | A1* | 10/2013 | Liu | G01R 19/0092 |
| | | | | 330/254 |
| 2015/0268277 | A1 | 9/2015 | Marten | 324/123 R |
| 2017/0115676 | A1* | 4/2017 | Yazdi | G05D 23/2033 |

OTHER PUBLICATIONS

International Search Report and Written Opinion, Application No. PCT/US2017/053158, 17 pages, dated Jan. 16, 2018.

"DS51527A: Voltage Supevisor SOT-23-5/6 Evaluation Board User's Guide," Microchip Technology Incorporated, 44 pages, ©2005.

Moghe, Yashodhan et al., "Nanosecond Delay Floating High Voltage Level Shifters in a 0.35 μm HV-CMOS Technology," IEEE Journal of Solid-State Circuits, vol. 46, No. 2, pp. 485-497, Dec. 10, 2010.

"INA28x High-Accuracy, Wide Common-Mode Range, Bidirectional Current Shunt Monitors, Zero-Drift Series," INA282, INA283, INA284, INA285, INA286, Texas Instruments, www.ti.com, 36 pages, May 2015.

"AD8207: Zero-Drift, High Voltage, Bidirectional Difference Amplifier," Analog Devices, www.analog.com, 17 pages, Aug. 30, 2016.

* cited by examiner

| Key Spec | AD8207 | INA282 | MCP6C0X |
|---|---|---|---|
| Bandwidth | 150kHz | 10kHz | 600kHz |
| Current consumption | 2.5mA max | 900uA max | 750uA max |
| CMRR | 105dB typical | 140dB typical | 150dB typical |
| Offset | 100uV typical | 70uV Max | 20uV Max |
| Offset drift | 1uV/C max | 1.5uV/C max | 0.2uV/C max |
| Package | SOIC8 | SOIC8 | SOT23 |

Figure 11

CURRENT SENSE AMPLIFIER ARCHITECTURE AND LEVEL SHIFTER

RELATED PATENT APPLICATION

This application claims priority to commonly owned U.S. Provisional Patent Application No. 62/399,025; filed Sep. 23, 2016; which is hereby incorporated by reference herein for all purposes.

TECHNICAL FIELD

The present disclosure relates to current sense circuit architectures, and, more particularly, to high-side current sense circuits with enhanced common-mode rejection ratios (CMRRs) and reduced voltage offsets, and, in addition, to high-voltage level shifters that minimize time delays between high-voltage and low-voltage clocks.

BACKGROUND

The ability to sense supply currents is useful in many electronic systems. Current sensing is used in such applications as over-current protection and monitoring of battery charge level, helping maintain desired power levels and to prevent circuit faults and over-discharged batteries. One method for determining current (referred to as magnetic sensing) is via measurement of the magnetic field around a current-carrying conductor, but such an approach is costly, not without sources of error, and is limited to AC current measurement. Another method of determining current (referred to as resistive sensing) is through placement of a small resistor in the current path, and measurement of the voltage drop across the resistor. Specifically, a small voltage drop across a "current-sense" resistor ("Rsense"), that is placed in series with the voltage source (e.g., battery), and the load, is measured. If Rsense 506 is connected in series with the "hot wire" (e.g., with the high-voltage power supply), this is referred to as high-side current sensing. Connecting Rsense 506 to ground would be referred to as low-side current sensing. The voltage drop can then be amplified to produce an output signal that is proportional to current. The value of Rsense 506 should be low to minimize power dissipation in the current sense resistor, but it should be high enough to produce a voltage drop that is detectable by the sensor amplifier.

Referring initially to FIG. 1, a prior art current-sensing circuit includes a zero-drift operational amplifier 102 and pairs of laser-trimmed resistors 104 for attenuating the input common-mode voltage to within the supply range of the amplifier 102. Common-mode noise in the power supply is not rejected if there is a difference in the resistance values of the resistors 104, and the resistors 104 must be precisely matched to balance inputs to the amplifier 102 for achieving a high CMRR. Laser trimming may be used to precisely match the resistors 104 to each other, and that increases the cost of the integrated circuit die (chip). Also, because imperfections in the resistors 104 are inevitable in real-world applications, the accuracy of the circuit is reduced despite the costly attempt at matching resistors 104 via laser trimming. Moreover, such a resistor network increases the size of the package, something that is undesirable when space is limited in small electronics. Furthermore, the resistor network increases the current draw (Idd) from the terminals of the amplifier 102 and thus tends to waste more power. Such a circuit is implemented in the Analog Devices, Inc., datasheet for the AD8207.

Referring to FIG. 2, a current sense monitor includes a zero-drift amplifier 202, a second amplifier 204, and a network of capacitors and resistors. As with the circuit shown in FIG. 1, these capacitors and resistors must be precisely matched to achieve high CMRR, something that increases costs. The switching of the capacitors, in combination with the RC time constants of the capacitors, increases settling time (i.e., the time required for voltages to settle), which reduces bandwidth for the circuit (i.e., how rapidly a change in load current could be sensed). The network of capacitors and resistors also increases package size. Such a circuit is implemented in the Texas Instruments Inc., datasheet for the INA282.

Referring to FIG. 3, depicted is a prior art current-feedback instrumentation amplifier for high-side current-sensing with auto-zeroing features. This high-side current sensing circuit includes an instrumentation amplifier with chopping and auto-zeroing circuitry for lowering drift and DC offset. However, this architecture has greater complexity, higher noise, slower speed and requires a relatively larger die and package size to accommodate the larger number of components. Such a circuit is discussed in an article by Witte, Huijsing, & Makinwa, "A Current-Feedback Instrumentation Amplifier with 5 µV Offset for Bidirectional High-Side Current-Sensing, IEEE Journal of Solid-State Circuits, Vol. 43, No. 12, December 2008.

Because voltages arrive at circuits from different sources and at different times, a level shifter is useful to translate or shift voltage levels and domains. Prior level shifters, such as the one shown in FIG. 4, suffer from several drawbacks. For example, they may have a high number of digital latches resulting in higher overshoot currents from high voltage power supplies. They may also have input and output clocks with the same frequency, and only be able to show the result for high-voltage power supplies of, e.g., 10 volts, with no result available for higher voltages. Such a circuit is shown by Moghe, Lehmann, & Piessens, "Nanosecond Delay Floating High Voltage Level Shifters in a 0.35 µm HV-CMOS Technology," IEEE Journal of Solid-State Circuits, Vol. 46, No. 2, February 2011.

SUMMARY

Hence, there is a need for a zero-drift, current sense architecture with enhanced CMRR and reduced offset at high common-mode voltages. Preferably, the current sense circuit components do not require matching by laser trimming, and can be accommodated on a die for a small integrated circuit package. What is also needed is a level shifter with low clock time delay and accurate duty cycle, both of which are important for chopping and other circuit applications such as switching power supplies, motor control, etc.

According to an embodiment, a method for providing current measurement with a high side current sensing amplifier may comprise the steps of: providing a current sensing resistor coupled between a power supply voltage and a load coupled to the power supply through the current sensing resistor; providing a first high voltage amplifier; coupling an operating voltage input of the first high voltage amplifier to the power supply voltage; coupling a non-inverting input of the first high voltage amplifier to the power supply voltage; coupling a low resistance value resistor between the operating voltage input and the non-inverting input of the first high voltage amplifier; and coupling an inverting input of the first high voltage amplifier to the load.

According to a further embodiment of the method, may comprise the steps of: providing a first low voltage amplifier; coupling a non-inverting input of the first low voltage amplifier to a reference voltage; coupling an inverting input of the first low voltage amplifier to a feedback voltage; and coupling differential outputs of the first low voltage amplifier to differential outputs of the first high voltage amplifier. According to a further embodiment of the method, may comprise the step of coupling the differential outputs of the first high voltage and first low voltage amplifiers to differential outputs of a third low voltage amplifier. According to a further embodiment of the method, may comprise the step of coupling the differential outputs of the third low voltage amplifier to differential inputs of an operational amplifier output buffer.

According to a further embodiment of the method, may comprise the step of providing a chopping circuit, wherein the chopping circuit may comprise: a first chopping switch coupled between the differential inputs of the first high voltage amplifier and differential inputs of a second high voltage amplifier; a second chopping switch coupled between the differential inputs of the first low voltage amplifier and differential inputs of a second low voltage amplifier; a third chopping switch coupled to differential outputs of the second high voltage amplifier and differential outputs of the second low voltage amplifier; wherein the differential outputs of the second high voltage amplifier may be coupled to the differential outputs of the second low voltage amplifier; and a low pass filter coupled between outputs of the third chopping switch and the differential inputs of the third low voltage amplifier.

According to a further embodiment of the method, may comprise the steps of providing a high voltage level shifter circuit with a high voltage clock output, wherein the high voltage level shifter circuit may comprise the steps of: providing a low voltage oscillator circuit operating at N-times a chopping frequency, where N may be equal to or greater than two (2); and proving a high voltage divide-by-N circuit having an input coupled to the low voltage oscillator circuit and providing a high voltage clock output at the chopping frequency; wherein one edge of the low voltage oscillator circuit may be used to regenerate the high voltage clock output.

According to another embodiment, an amplifier architecture fabricated on an integrated circuit (IC) die, comprising: a first IC die pad adapted for coupling to a power supply voltage and coupled to an operating voltage input (VDDHV) of an amplifier; a second die pad adapted for coupling to the power supply voltage and coupled to a non-inverting input (VIP) of the amplifier; a third die pad coupled to an inverting input (VIM) of the amplifier and adapted for coupling to a sense resistor coupled to a load, wherein the sense resistor may be coupled between the power supply voltage and the load; and a resistor (Rs) may be fabricated on the IC die and coupled between the first and second die pads, whereby induced voltage offset of the amplifier may be reduced.

According to a further embodiment, the amplifier architecture may be adapted for use in any self-correcting offset system, such as auto-zero and chopper stabilized circuits. According to a further embodiment, the amplifier architecture may comprise a single electrostatic discharge (ESD) circuit coupled to the second die pad and providing ESD protection for both the operating voltage input and the non-inverting input of the amplifier.

According to yet another embodiment, a current sensing amplifier, comprising: a first high voltage amplifier fabricated on an integrated circuit (IC) die and having an operating voltage input (VDDHV) adapted for coupling to a high voltage supply, a first input (VIP) and a second input (VIM) adapted for coupling to a current sense resistor coupled between the high voltage supply and a load, wherein the first input (VIP) may be coupled to the high voltage supply side of the current sense resistor and the second input (VIM) may be coupled to the load side of the current sense resistor; a resistor (Rs) fabricated on the IC die and coupled between the operating voltage input (VDDHV) and the first input (VIP) of the first high voltage amplifier; a first low voltage amplifier having first and second inputs adapted for coupling to a reference voltage (VREF) and a feedback voltage (VFBK), respectively; and first and second outputs of the first high voltage amplifier may be coupled to first and second outputs, respectively, of the first low voltage amplifier; and a third low voltage amplifier having first and second inputs coupled to first and second outputs of the first high voltage and first low voltage amplifiers, respectively; and an operational amplifier output buffer having differential inputs coupled to the differential outputs of the first high and low voltage amplifiers.

According to a further embodiment, a chopping circuit may be coupled between the first and second inputs of the first high and low voltage amplifiers, and the differential inputs of the operational amplifier output buffer.

According to a further embodiment, the chopping circuit may comprise: a first chopping switch coupled between the first and second inputs of the first high voltage amplifier and first and second inputs of a second high voltage amplifier; a second chopping switch coupled between the first and second inputs of the first low voltage amplifier and first and second inputs of a second low voltage amplifier; a third chopping switch coupled to first and second outputs of the second high voltage amplifier and first and second outputs of the second low voltage amplifier; wherein the first and second outputs of the second high voltage amplifier may be coupled to the first and second outputs of the second low voltage amplifier; a low pass filter coupled to first and second outputs of the third chopping switch; and a third low voltage amplifier having first and second inputs coupled to first and second outputs of the low pass filter, and first and second outputs coupled to the first and second outputs of the first high and low voltage amplifiers, respectively.

According to a further embodiment, the high voltage amplifiers may be transconductance amplifiers. According to a further embodiment, the low voltage amplifiers may be transconductance amplifiers. According to a further embodiment, the low pass filter may be a switched capacitor low pass filter. According to a further embodiment, a high voltage level shifter circuit may provide a high voltage clock output.

According to a further embodiment, the high voltage level shifter circuit may comprise: a low voltage oscillator circuit operating at N-times a chopping frequency, where N may be equal to or greater than two (2); and a high voltage divide-by-N circuit having an input coupled to the low voltage oscillator circuit and providing a high voltage clock output at the chopping frequency; wherein one edge of the low voltage oscillator circuit may be used to regenerate the high voltage clock output. According to a further embodiment, an electrostatic discharge protection circuit may be coupled to the first input of the first high voltage amplifier. According to a further embodiment, the first amplifier input may be a non-inverting input and the second amplifier input may be an inverting input.

BRIEF DESCRIPTION OF THE DRAWINGS

A more complete understanding of the present disclosure may be acquired by referring to the following description taken in conjunction with the accompanying drawings wherein:

FIG. 11 illustrates a table of key specifications for the prior art circuits of FIGS. 1 and 2, and the exemplary architectures of FIGS. 5, 6, and 9.

Figure 1:
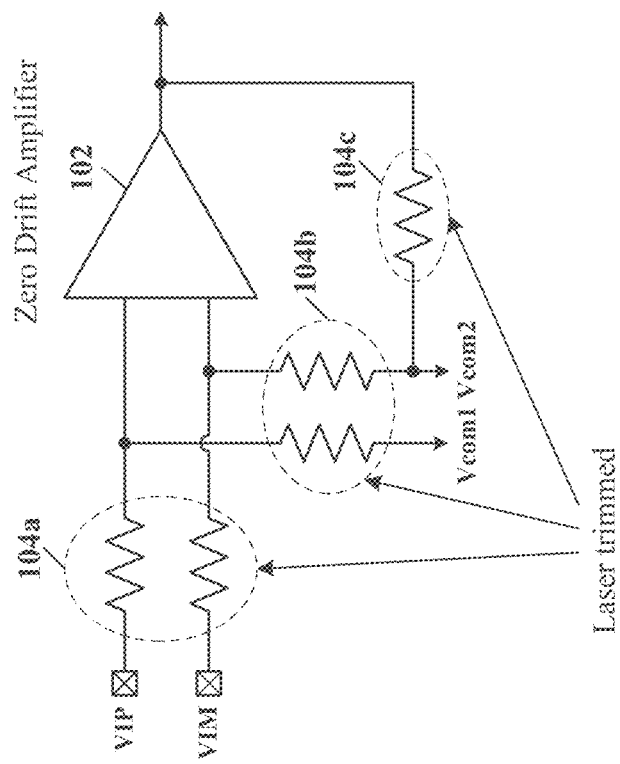
FIG. 1 illustrates a prior art current sense amplifier with a network of laser-trimmed resistors.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

According to various embodiments, an exemplary voltage sensing architecture of the present disclosure addresses the above drawbacks as well as others. The voltage sensing architecture of the present disclosure is a simplification and improvement over prior art voltage sensing circuits by using chopping only, without requiring auto-zeroing, and by using a simpler (and faster) switched capacitor filter instead of an auto-zeroing integrator filter. Also, VIP (positive DC sense node) is merged with VDDHV (power supply), such that the integrated circuit package requires only a single node (package pin) to accommodate both VIP and VDDHV connections. These features help reduce power requirements, complexity, noise, and die and package sizes. CMRR is also enhanced, without the need for precise trimming of resistors and capacitors. Moreover, a very low DC offset greatly reduces the power wasted in the sense resistor by using a low value resistance for the sense resistor. Furthermore, a high voltage fast level shifter which consumes no DC current is presented which is ideal for use in low-power applications. Other details, features, and advantages are discussed below in conjunction with the referenced drawings disclosed and described hereinafter.

Referring now to the drawings, the details of example embodiments are schematically illustrated. Like elements in the drawings will be represented by like numbers, and similar elements will be represented by like numbers with a different lower-case letter suffix.

Figure 5:
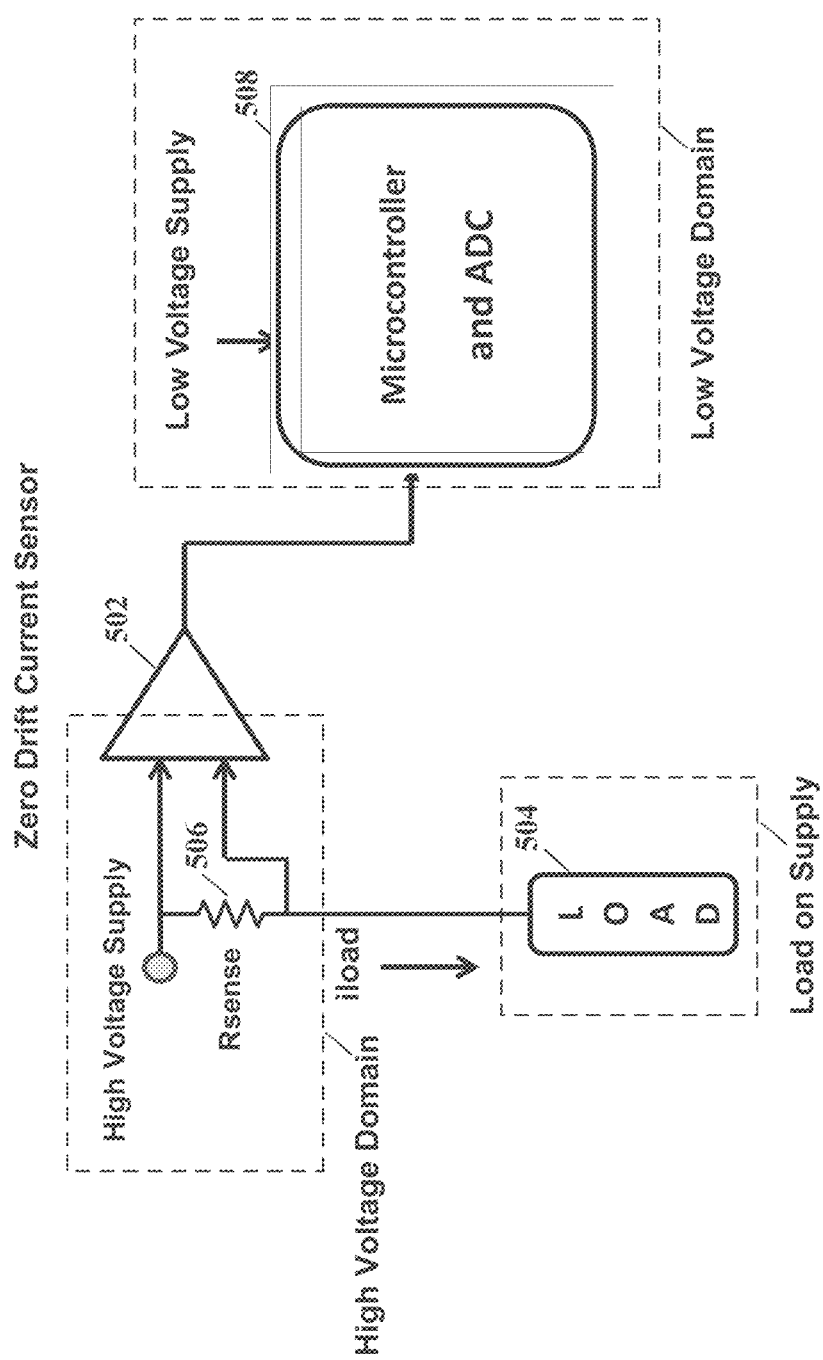
FIG. 5 illustrates a schematic block diagram of a high-side current sensing system, according to the teachings of this disclosure.

Referring now to FIG. 5, depicted is a schematic block diagram of a high-side current sensing system, according to the teachings of this disclosure. An exemplary circuit architecture of the present disclosure may comprise a zero-drift current sensor 502 that may be provided as part of an integrated circuit package (see FIG. 7). When installed in an electronic system, the high-side current sensor may be coupled to an external small resistance value resistor, Rsense 506, that connects a high voltage (HV) power supply (not shown) to a load 504. The output of the sensor 502 may be a DC voltage that is proportional to the current through the Rsense 506. This DC sense voltage may be coupled to an analog-to-digital converter (ADC) in a microcontroller 508 for digitization and interpretation thereof, thereby allowing the power consumed by the load 504 to be measured. This DC sense voltage may be converted from a high-voltage domain to a low-voltage domain, and then coupled to the ADC/microcontroller 508 at this low voltage. As will be further discussed below, because of the low offset achieved by the current sensor 502, a lower value resistance may be used for Rsense 506, and the power consumed (wasted) by the Rsense 506 may thereby be significantly reduced.

Figure 6:
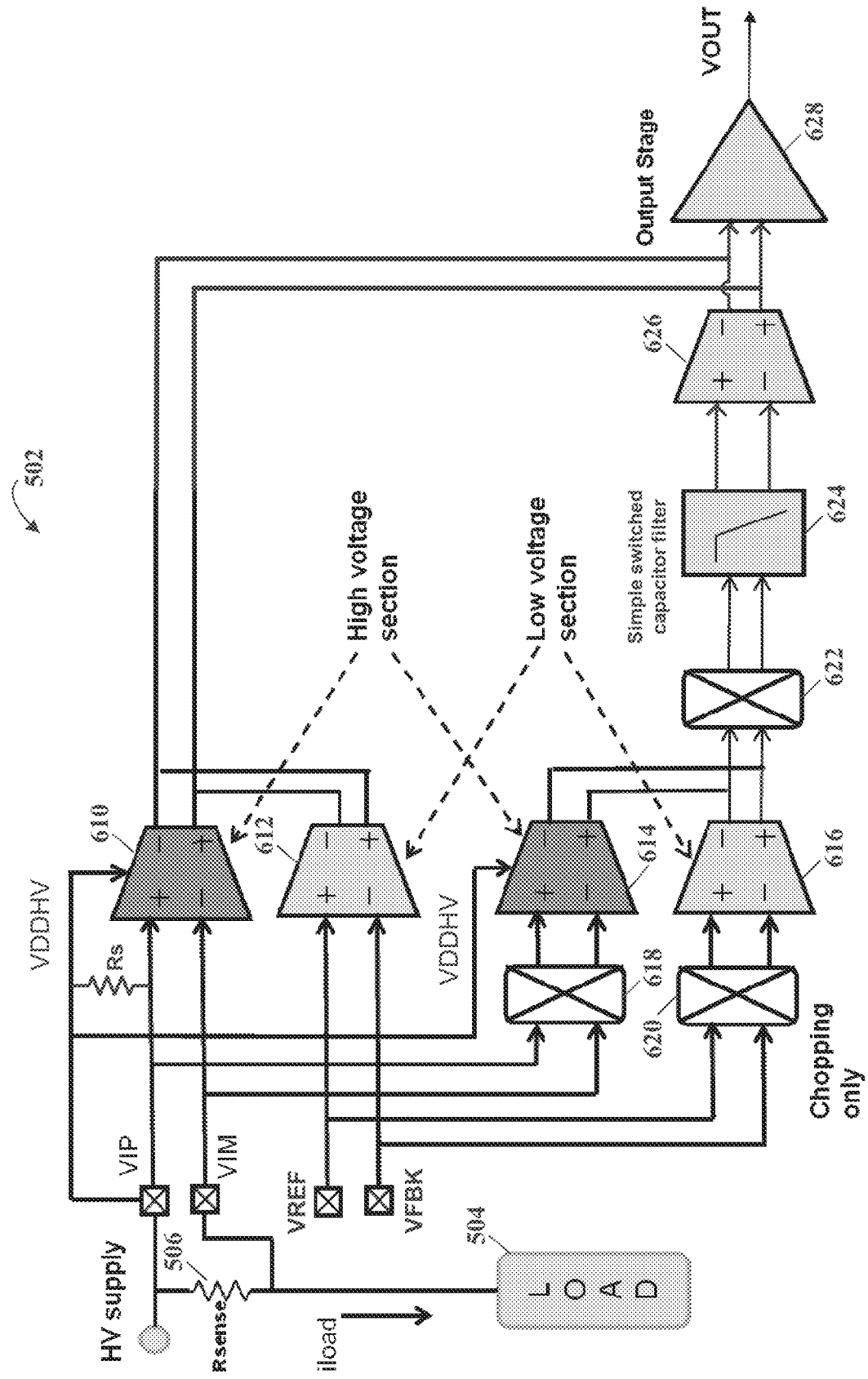
FIG. 6 illustrates a schematic block diagram of a high-side current-sensing architecture, according to a specific example embodiment of the present disclosure.

Referring to FIG. 6, depicted is a schematic block diagram of a high-side current-sensing architecture, according to a specific example embodiment of the present disclosure. A zero-drift current sensor circuit, generally represented by the numeral 502, may comprise a first transconductance amplifier 610, a second transconductance amplifier 612, a third transconductance amplifier 614, a fourth transconductance amplifier 616, a first chopping switch 618, a second chopping switch 620, a third chopping switch 622, a switched capacitor filter 624, a fifth transconductance amplifier 626, and an operational amplifier output buffer 628. The first and third amplifiers 610 and 614 may comprise high voltage transconductance amplifiers with differential inputs and outputs. The second, fourth and fifth amplifiers 612, 616 and 626 may comprise low voltage transconductance amplifiers having differential inputs and outputs. The first chopping switch 618 may be rated for high voltage operation. The low pass filter 624 may be a simple switched capacitor low pass filter. The chopping switches 618, 620 and 622 interchange the polarity of signals to the inputs of the amplifiers 614 and 616, and the low pass filter 624 during a chopping operation. The VREF and VFBK nodes may be coupled to a feedback network (not shown) for setting the gain (amplification) of the current sensor circuit 502.

Figure 3:
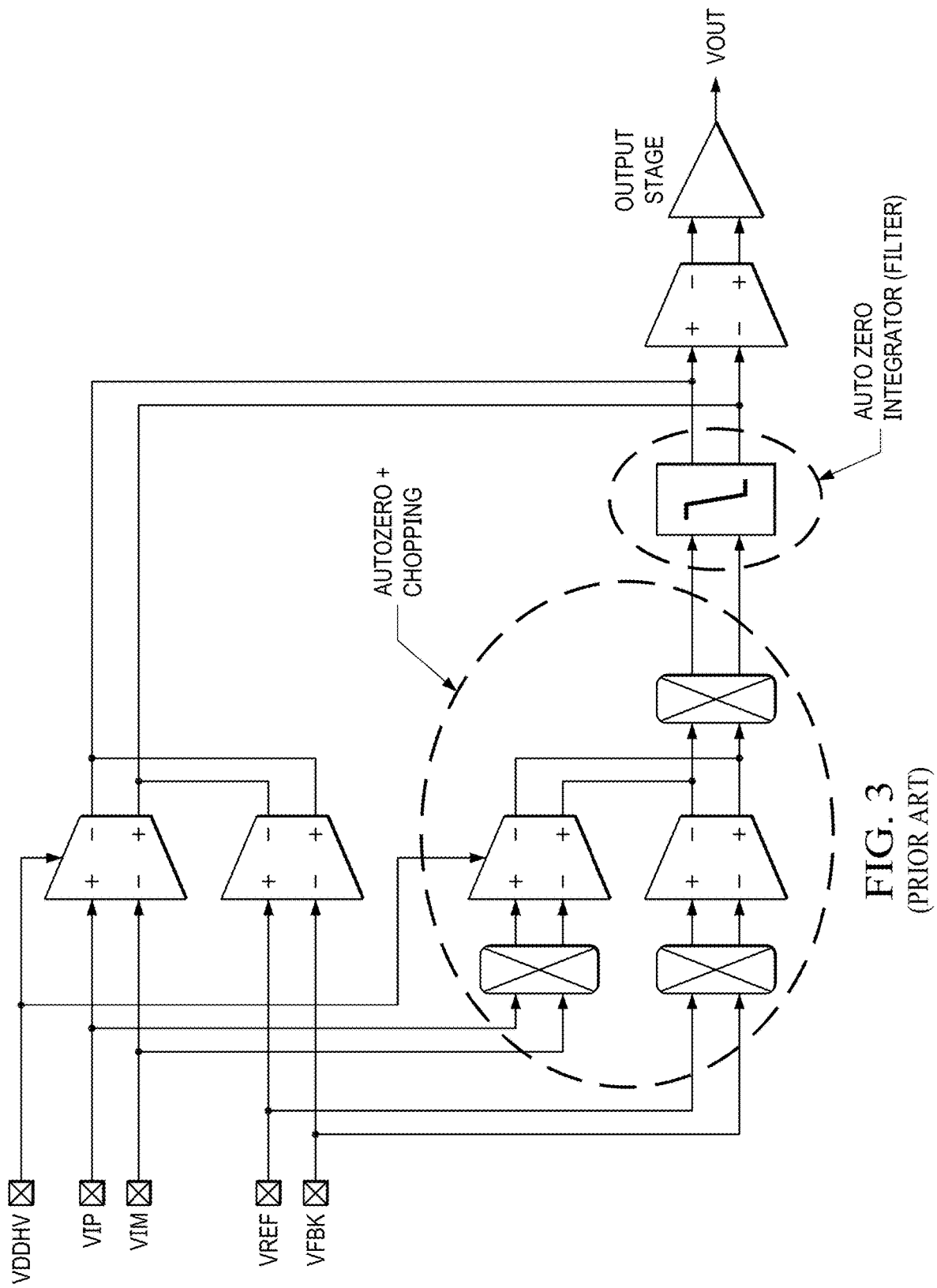
FIG. 3 illustrates a prior art current-feedback instrumentation amplifier for high-side current-sensing with auto-zeroing features.
Figure 4:
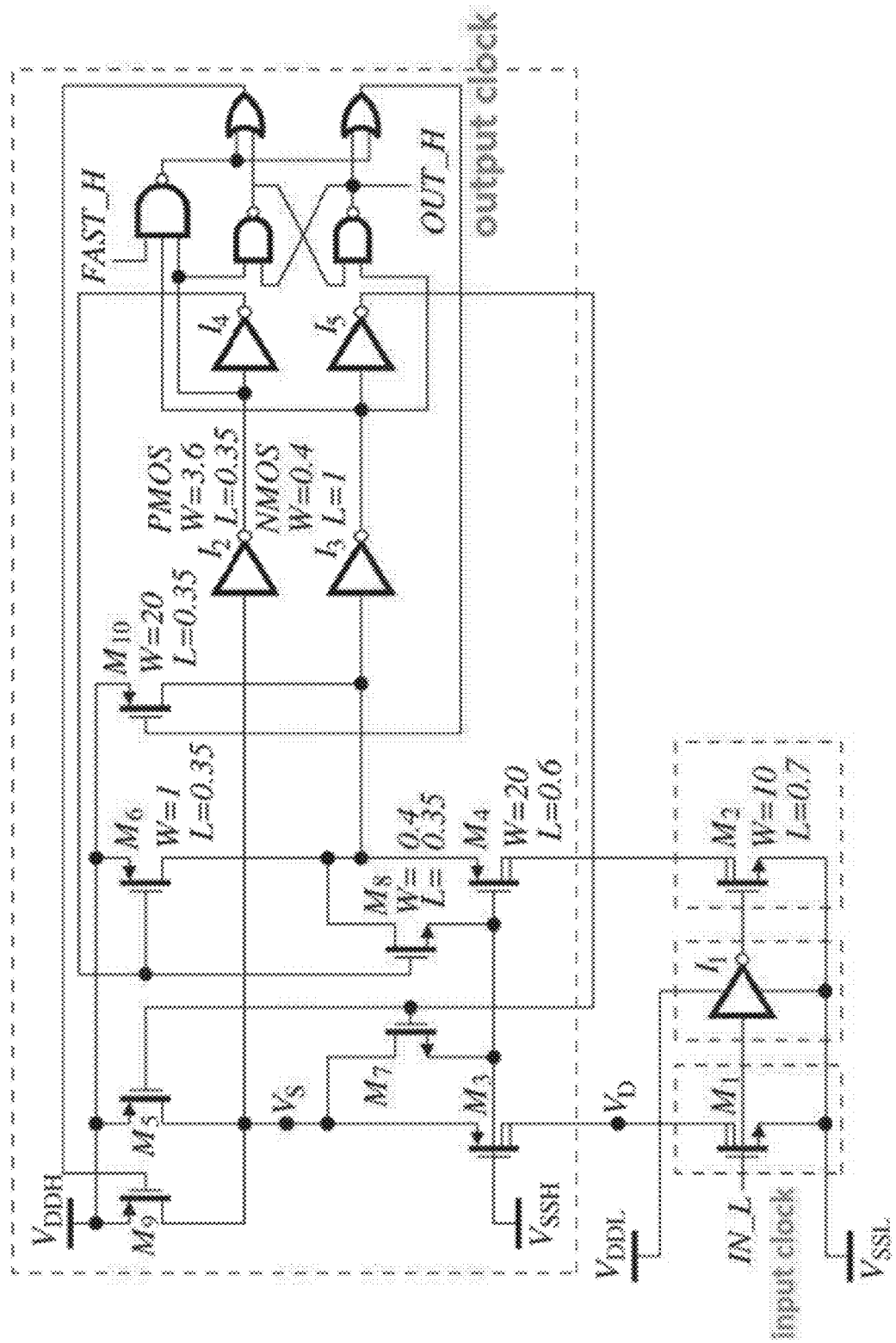
FIG. 4 illustrates a prior art high voltage level shifter in a 0.35 μm HV-CMOS process.

The first and third amplifiers 610 and 614 comprise a high-voltage section and the second and fourth amplifiers 612 and 616 comprise a low-voltage section of the current sensor circuit 502. In contrast to the high side current sensing circuit shown in FIG. 3, the circuit architecture of FIG. 6 provides chopping without requiring auto-zeroing, and does not require the auto-zeroing integrator filter which is relatively slower in passing signals. Just a simple switched capacitor filter 624 is required to more quickly filter signal ripples resulting from the chopping circuitry and provide a smoother DC output. The circuit architecture shown in FIG. 6 may achieve an enhanced CMRR without laser trimming of component values, and it reduces power consumption, complexity, noise, and die size.

Figure 7:
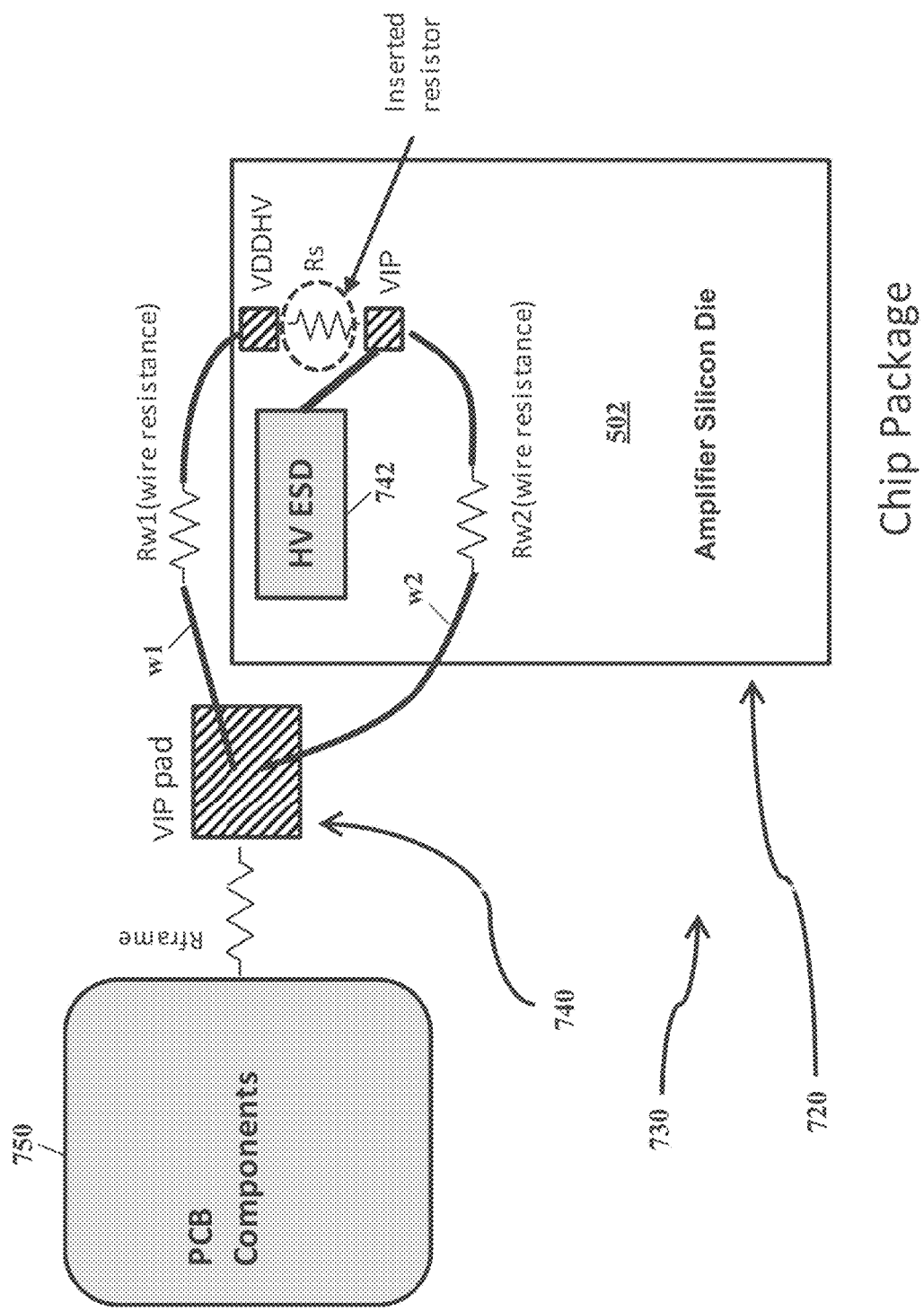
FIG. 7 illustrates a schematic block diagram of an integrated circuit package with a sensing circuit die therein, according to specific example embodiments of the present disclosure.

Referring to FIG. 7, depicted is a schematic block diagram of an integrated circuit package with a sensing circuit die therein, according to specific example embodiments of this disclosure. The current sensor circuit 502 shown in FIG. 6 may be fabricated on an integrated circuit (IC) die 720 and coupled to a connection node 740 (e.g., pad, pin) of an IC package 730 enclosing the IC die 720. A wire w1, having a resistance Rw1, may connect the VDDHV node of the IC die 720 to the VIP pad 740, and wire w2, having a resistance Rw2, may connect the VIP node of the IC die 720 to the VIP pad 740. Furthermore, a low resistance resistor, Rs, may be coupled between the VDDHV and VIP nodes of the IC die 720. Thus, only one external connection is required on the IC package 730 for coupling to the VIP terminal shown in FIG. 6.

Interfacing with the IC package 730 may be printed circuit board (PCB) components block 750, representing other electronic components in the electronic system incorporating the IC package 730. As may be noted, there is only one connection required for both the high voltage supply (power) and VIP (the sensing input) to the IC package 730 (also shown in FIGS. 6 and 9. In this circuit configuration, the voltage between VIP and VIM (Rsense voltage drop—FIG. 6) is what is sensed by the current sensing circuit 502.

Therefore, the high voltage power supply VDDHV and VIP are effectively coupled together via a first wire w1 connecting the VDDHV node of the IC die 720 to the VIP pad 740, and a second wire w2 connecting the VIP node of the IC die 720 to the VIP pad 740. Merging the VDDHV and current sensor circuit 502 positive (VIP) inputs into one pad 740 helps this circuit fit into smaller packages (such as the SOT-23), but as a consequence, supply current flows into VDDHV. This current flows through wires w1 and w2, and causes a voltage drop. This voltage drop is considered an "input current induced" voltage offset. To counter this offset, a small resistance value resistor Rs may be connected internally between the VDDHV and VIP nodes of the IC die 720. While Rs is in series between the VDDHV and VIP nodes of the IC die 720, it is connected in parallel with Rw1 and Rw2, the resistances of wires w1 and w2. Adding resistor Rs substantially reduces the offset resulting from the measured input current.

As seen in FIG. 7, the IC die 720 may also include an "HV ESD" block 742 representing a circuit (which can be in the form of a specialized chip device) intended to protect circuit components against electrostatic discharge (ESD) events. If the VDDHV and VIP nodes were separate, the VDDHV and VIP nodes would each have to be provided with an HV ESD circuit for protection (each of which can require a significant amount of space on the die). Advantageously, connecting the VDDHV and VIP nodes together with the low resistance resistor Rs means that only one HV ESD circuit is needed, saving space and allowing for a decrease in IC die and package sizes.

Figure 10:
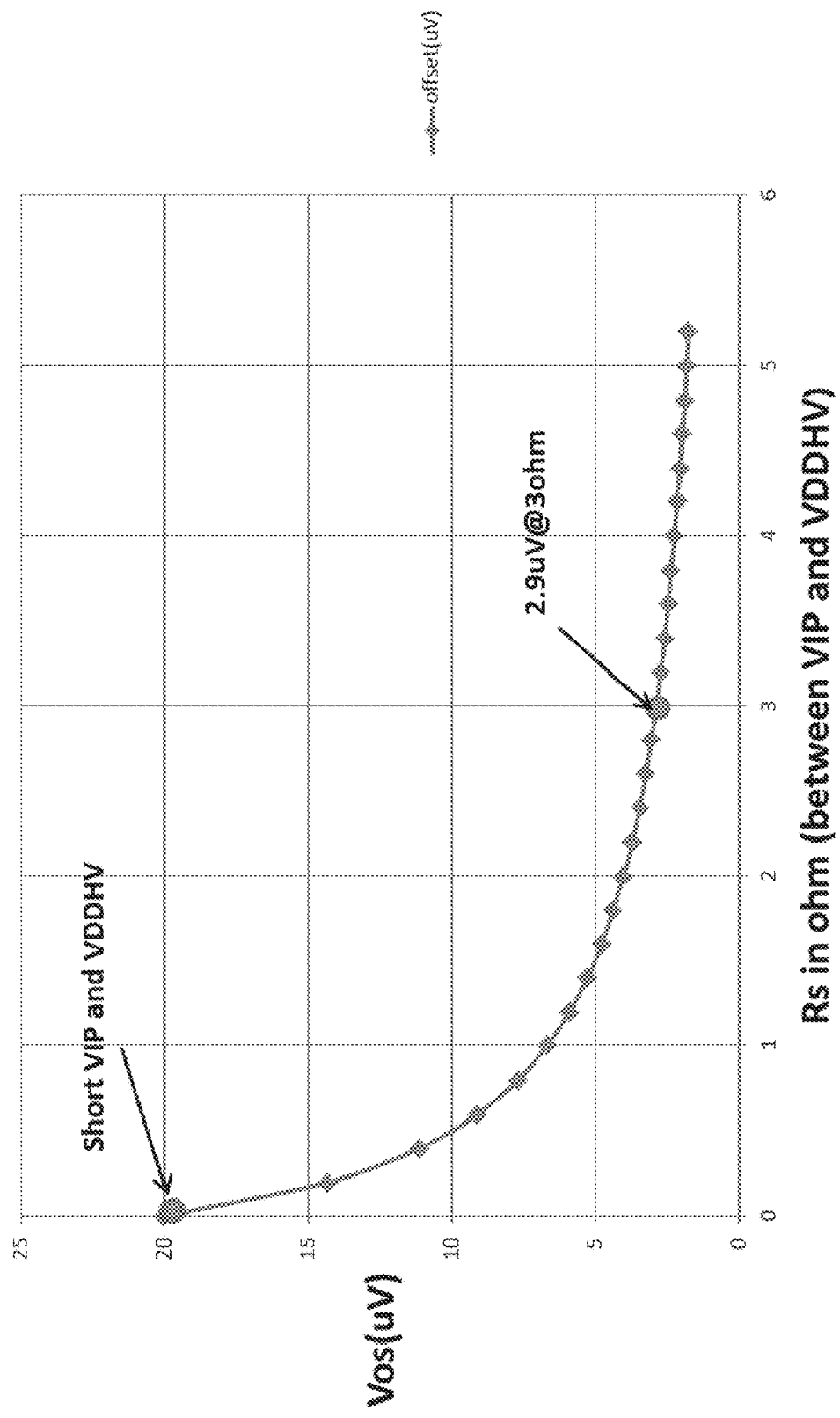
FIG. 10 illustrates a schematic graph representing the relationship between offset voltage (Vos) in microvolts and resistance values (Rs) in ohms, according to the teachings of the present disclosure.

Referring now to FIG. 10, depicted is a schematic graph representing the relationship between offset voltage (Vos) in microvolts and resistance values (Rs) in ohms, according to the teachings of the present disclosure. Adding a low resistance value resistor Rs between the VDDHV and VIP nodes of the IC die 720 greatly reduces the effects of voltage offset induced by input current. The amount of induced voltage offset ("Voffset_induced") can be determined using the following equation:

$$V_{offset\_induced} = \frac{IddHv \times Rw1 \times Rw2}{(Rw1 + Rw2 + Rs)}$$

In this equation, IddHv is the input current, Rw1 and Rw2 are the resistances (in ohms) of the shorting wires w1 and w2, respectively, and Rs is the resistance (in ohms) of Rs. As can be observed in the equation, increasing the sum of Rw1, Rw2, and Rs (i.e., the denominator) decreases offset voltage because of their inverse relationship. Consequently, as represented in the graphic plot shown in FIG. 10, the voltage offset in microvolts decreases as the value for Rs increases. Without a Rs resistor (e.g., if VDDHV and VIP were shorted and Rs was zero), the offset voltage would be 20 microvolts. If the Rs resistor has a value of three (3) ohms, the offset voltage drops significantly, down to 2.9 microvolts in the graph. It is noted that the resistances Rw1 and Rw2 for copper wires w1 and w2 would be expected to be about 0.2 ohms each.

Figure 8:
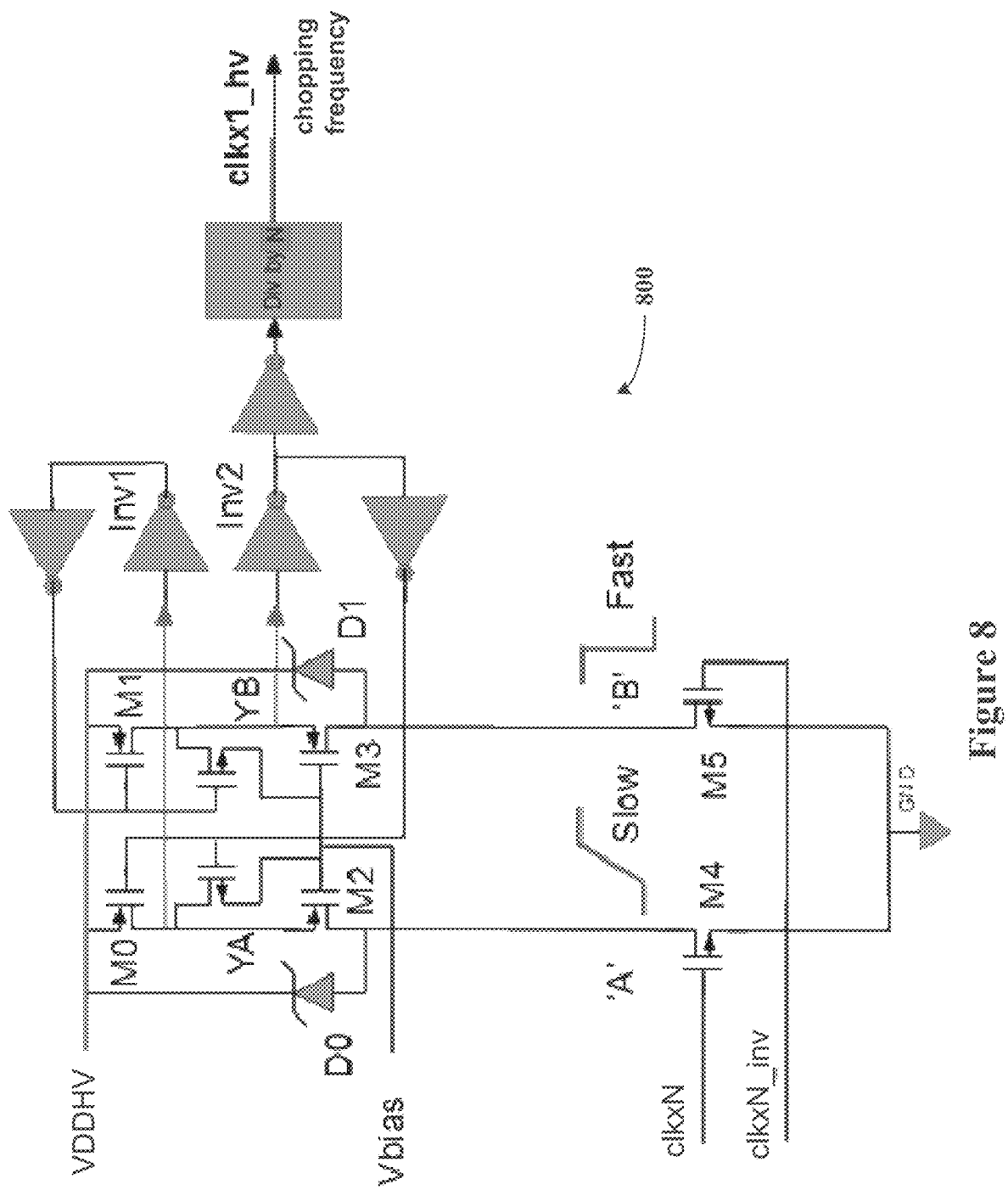
FIG. 8 illustrates a schematic diagram of a high-voltage level shifter having very small signal propagation time delay, according to a specific example embodiment of the present disclosure.

Referring now to FIG. 8, depicted is a schematic diagram of a high-voltage level shifter having very small signal propagation time delay. An ultra-low delay high voltage level shifter design utilizes one edge of the low voltage input clock running at twice the high voltage chopping clock operating frequency to regenerate the high voltage clock output. The resulting delay between the low voltage and high voltage chopping clock is very small comparing with the prior art level shifters. Also, this design can work at much higher operating voltage.

Figure 9:
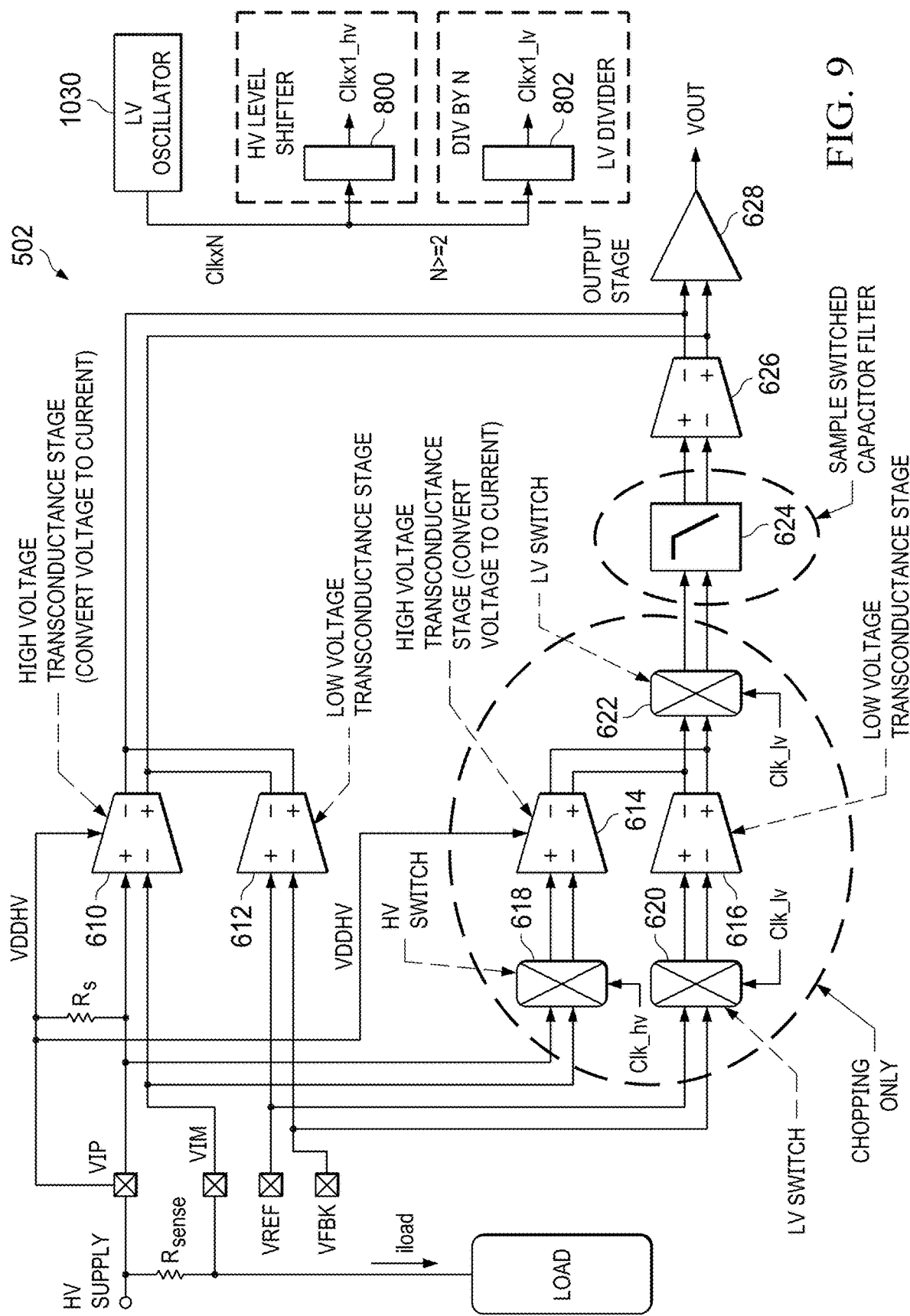
FIG. 9 illustrates a schematic block diagram of the circuit architecture shown in FIG. 6 and the high-voltage level shifter shown in FIG. 8, according to specific example embodiments of the present disclosure.

Shown in FIG. 8 is an exemplary high-voltage level shifter circuit, generally represented by the numeral 800, that provides low clock delay between a low-voltage clock and a high-voltage clock (see FIG. 9). Although the low-voltage clock (FIG. 9) is generated at the low-voltage domain, the circuit (such as the chopping circuit) requires a precise high-voltage clock (FIG. 9), with a minimum (short) time delay between the high-voltage and low-voltage clocks. The high-voltage clock should track the low-voltage clock, such that they are effectively synchronized with each other. This is particularly useful here because both low delay and accurate duty cycle are critical for chopping circuits. The level shifter circuit of FIG. 8 uses a system clock at a multiple N of the operating frequency (chopping frequency), where N is equal to or greater than two (2), to achieve very low delay between high voltage and low voltage chopping clocks. Since the high voltage clock is divided by N the 50% duty cycle is guaranteed. The very fast falling edge of the clkxN at point "B" may be used to re-generate normal chopping clocks clkhv1 and clkhv2 (see system diagram of FIG. 9). Because this level shifter consumes no DC current, it is well-suited for use in low power environments.

When input clkxN clock is low, it will turn off device M4. Node "A" will be charged to high voltage in relatively long time. At the same time, input clkxN_inv is high. It will turn on device M5. Node "B" will be pulled down to a low voltage very fast. Devices M1, M2, M3, M4 form a latch to generate fast switching voltage at node "YA" and "YB". Since node "B" can be very fast pulling down, node "YB" has a fast falling edge. The falling edge of "YB" will trigger a "divide-by-N" circuits to generate a fast clkx1_hv clock edge. This level shifter design can achieve very small delay between the input low voltage clock and output high voltage clock.

Referring to FIG. 9, depicted is a schematic block diagram of the circuit architecture shown in FIG. 6 and the high-voltage level shifter shown in FIG. 8, according to specific example embodiments of the present disclosure. The current sensor circuit 502 is further associated with a low voltage clock oscillator 1030 providing the N times chopping frequency clock signal to an input of the high-voltage level shifter 800 (see FIG. 8) that provides the high-voltage chopping frequency clock signal to the current sensor circuit 502.

Figure 2:
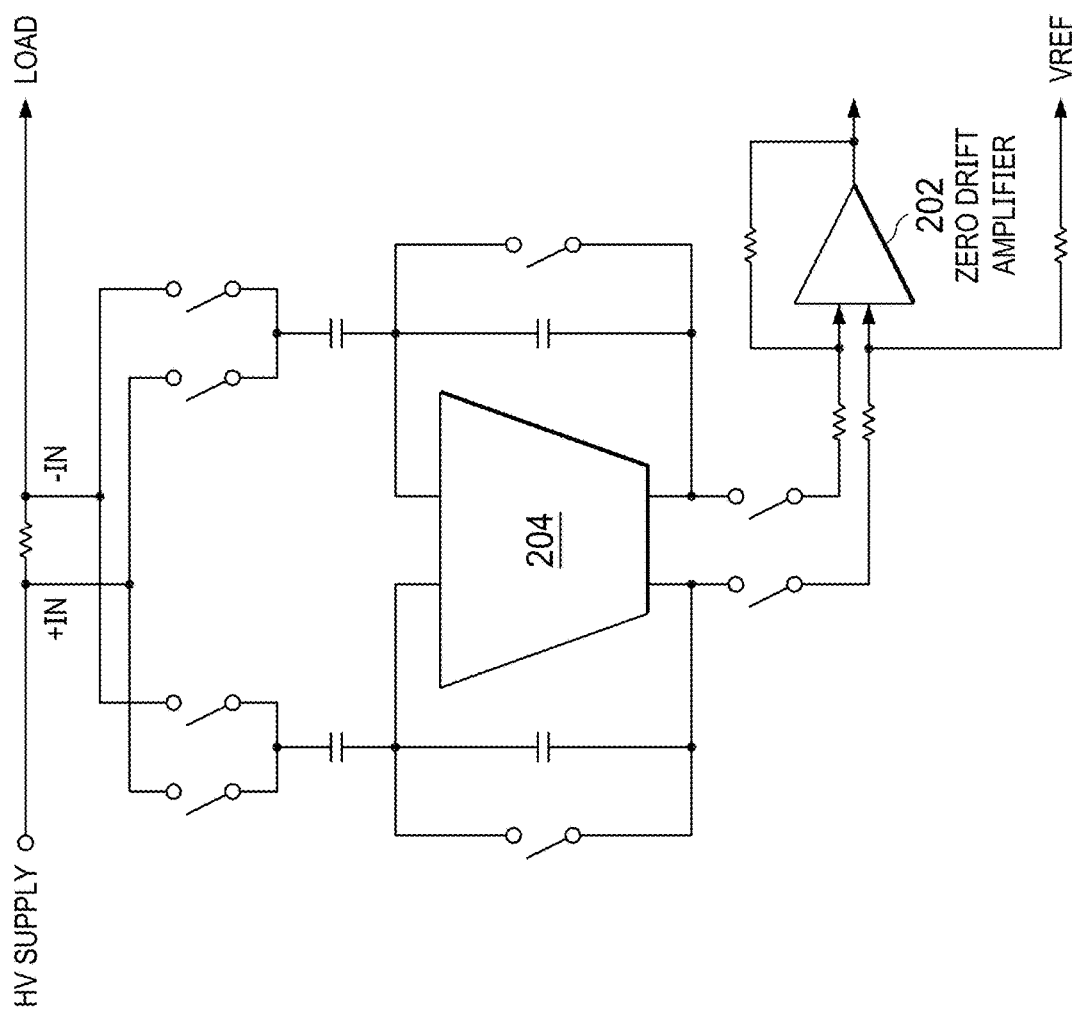
FIG. 2 illustrates a prior art zero-drift current shunt monitor with a network of precisely-matched resistors and capacitors.

Referring to FIG. 11, depicted is a table of key specifications for the prior art circuits of FIGS. 1 and 2, and the exemplary architectures of FIGS. 5, 6, and 9. This table clearly shows that the exemplary architectures of the present disclosure significantly improve upon key specifications for such circuits. For comparison, the expected bandwidth for the circuit represented in FIG. 1 is 150 kHz, with a maximum current consumption of 2.5 mA and a typical CMRR of 105 decibels (dB). The typical offset is expected to be around 100 µV, with a maximum offset drift of about 1 µV/° C. A suitable package is the 8-pin MSOP8. For the circuit represented in FIG. 2, the expected bandwidth is 10 kHz, with a maximum current consumption of 900 µA and a typical CMRR of 140 B. The typical offset is expected to be around 70 µV, with a maximum offset drift of 1.5 µV/° C. A suitable package is the 8-pin SOIC8.

By contrast, the exemplary circuit architecture in accordance with this disclosure achieves a dramatically higher bandwidth than prior art approaches at 600 kHz (versus 150 kHz for the one in FIG. 1 and 10 kHz for the one in FIG. 2). The current consumed by the current-sensing circuit 502 is also substantially reduced to a maximum of 750 microamps (as opposed to 2.5 milliamps for the one in FIG. 1, and 900 microamps for the one in FIG. 2). The CMRR achieved is expected to be about 143 dB, which is higher than the 105 and 140 dB values for the circuits in FIGS. 1 and 2, respectively. The voltage offset is dramatically reduced to a maximum of 20 microvolts, from the prior art circuit maximums of 100 and 70 microvolts. The offset drift is also lower, down to a maximum of 0.2 microvolts per degree C. The improvement on offset drift is mainly due to the dynamic offset correction scheme used by the architecture disclosed herein. The package size is also reduced to the smaller SOT23 package, rather than the larger MSOP8 for the circuit of FIG. 1, and SOIC8 for the circuit of FIG. 2.

The present disclosure has been described in terms of one or more embodiments, and it should be appreciated that many equivalents, alternatives, variations, and modifications, aside from those expressly stated, are possible and within the scope of the disclosure. For example, the level shifter is particularly advantageous in the exemplary current-sensing architecture disclosed above because the chopping circuitry in the package of FIG. 9 benefits from lower delays between clocks; consequently, this level shifter enhances performance. However, the level shifter of FIG. 8 can be used in other circuits that benefit from level shifters in general. Also, although the exemplary circuit architectures discussed combine multiple features to achieve the enhanced specifications discussed above, not all of these features are necessarily required for improved results. For example, the VDDHV (high voltage power supply) and VIP pins may be merged without the "chopping and/or auto-zeroing" features disclosed herein.

What we claim:

1. A method for providing current measurement with a high side current sensing amplifier, said method comprising the steps of:
    providing a current sensing resistor coupled between a power supply voltage and a load coupled to the power supply through the current sensing resistor;
    providing a first high voltage amplifier;
    coupling an operating voltage input of the first high voltage amplifier to the power supply voltage;
    coupling a non-inverting input of the first high voltage amplifier to the power supply voltage;
    coupling a low resistance value resistor between the operating voltage input and the non-inverting input of the first high voltage amplifier;
    coupling an inverting input of the first high voltage amplifier to the load;
    providing a first low voltage amplifier;
    coupling a non-inverting input of the first low voltage amplifier to a reference voltage;
    coupling an inverting input of the first low voltage amplifier to a feedback voltage;
    coupling differential outputs of the first low voltage amplifier to differential outputs of the first high voltage amplifier;
    coupling the differential outputs of the first high voltage and first low voltage amplifiers to differential outputs of a third low voltage amplifier;
    coupling the differential outputs of the third low voltage amplifier to differential inputs of an operational amplifier output buffer;
    providing a chopping circuit, wherein the chopping circuit comprises:
        a first chopping switch coupled between the differential inputs of the first high voltage amplifier and differential inputs of a second high voltage amplifier;
        a second chopping switch coupled between the differential inputs of the first low voltage amplifier and differential inputs of a second low voltage amplifier;
        a third chopping switch coupled to differential outputs of the second high voltage amplifier and differential outputs of the second low voltage amplifier;
        wherein the differential outputs of the second high voltage amplifier are coupled to the differential outputs of the second low voltage amplifier; and
        a low pass filter coupled between outputs of the third chopping switch and the differential inputs of the third low voltage amplifier.

2. The method according to claim 1, further comprising the steps of providing a high voltage level shifter circuit with a high voltage clock output, wherein the high voltage level shifter circuit comprises the steps of:
    providing a low voltage oscillator circuit operating at N-times a chopping frequency, where N is equal to or greater than two (2); and
    proving a high voltage divide-by-N circuit having an input coupled to the low voltage oscillator circuit and providing a high voltage clock output at the chopping frequency;
    wherein one edge of the low voltage oscillator circuit is used to regenerate the high voltage clock output.

3. An amplifier architecture fabricated on an integrated circuit (IC) die, comprising:
    a first IC die pad adapted for coupling to a power supply voltage and coupled to an operating voltage input (VDDHV) of an amplifier;
    a second die pad adapted for coupling to the power supply voltage and coupled to a non-inverting input (VIP) of the amplifier;
    a third die pad coupled to an inverting input (VIM) of the amplifier and adapted for coupling to a sense resistor coupled to a load, wherein the sense resistor is coupled between the power supply voltage and the load;

a resistor (Rs) is fabricated on the IC die and coupled between the first and second die pads, whereby induced voltage offset of the amplifier is reduced; and a single electrostatic discharge (ESD) circuit coupled to the second die pad and providing ESD protection for both the operating voltage input and the non-inverting input of the amplifier.

4. The amplifier architecture according to claim 3, is adapted for use in any self-correcting offset system, such as auto-zero and chopper stabilized circuits.

5. A current sensing amplifier, comprising:
- a first high voltage amplifier fabricated on an integrated circuit (IC) die and having
- an operating voltage input (VDDHV) adapted for coupling to a high voltage supply,
- a first input (VIP) and a second input (VIM) adapted for coupling to a current sense resistor coupled between the high voltage supply and a load, wherein the first input (VIP) is coupled to the high voltage supply side of the current sense resistor and the second input (VIM) is coupled to the load side of the current sense resistor;
- a resistor (Rs) fabricated on the IC die and coupled between the operating voltage input (VDDHV) and the first input (VIP) of the first high voltage amplifier;
- a first low voltage amplifier having first and second inputs adapted for coupling to a reference voltage (VREF) and a feedback voltage (VFBK), respectively; and
- first and second outputs of the first high voltage amplifier are coupled to first and second outputs, respectively, of the first low voltage amplifier; and
- a third low voltage amplifier having first and second inputs coupled to first and second outputs of the first high voltage and first low voltage amplifiers, respectively; and
- an operational amplifier output buffer having differential inputs coupled to the differential outputs of the first high and low voltage amplifiers.

6. The current sensing amplifier according to claim 5, further comprising a chopping circuit coupled between the first and second inputs of the first high and low voltage amplifiers, and the differential inputs of the operational amplifier output buffer.

7. The current sensing amplifier according to claim 6, wherein the chopping circuit comprises:
- a first chopping switch coupled between the first and second inputs of the first high voltage amplifier and first and second inputs of a second high voltage amplifier;
- a second chopping switch coupled between the first and second inputs of the first low voltage amplifier and first and second inputs of a second low voltage amplifier;
- a third chopping switch coupled to first and second outputs of the second high voltage amplifier and first and second outputs of the second low voltage amplifier;
- wherein the first and second outputs of the second high voltage amplifier are coupled to the first and second outputs of the second low voltage amplifier;
- a low pass filter coupled to first and second outputs of the third chopping switch; and
- a third low voltage amplifier having first and second inputs coupled to first and second outputs of the low pass filter, and first and second outputs coupled to the first and second outputs of the first high and low voltage amplifiers, respectively.

8. The current sensing amplifier according to claim 7, wherein the high voltage amplifiers are transconductance amplifiers.

9. The current sensing amplifier according to claim 7, wherein the low voltage amplifiers are transconductance amplifiers.

10. The current sensing amplifier according to claim 7, wherein the low pass filter is a switched capacitor low pass filter.

11. The current sensing amplifier according to claim 7, further comprising a high voltage level shifter circuit for providing a high voltage clock output.

12. The current sensing amplifier according to claim 11, wherein the high voltage level shifter circuit comprises:
- a low voltage oscillator circuit operating at N-times a chopping frequency, where N is equal to or greater than two (2); and
- a high voltage divide-by-N circuit having an input coupled to the low voltage oscillator circuit and providing a high voltage clock output at the chopping frequency;
- wherein one edge of the low voltage oscillator circuit is used to regenerate the high voltage clock output.

13. The current sensing amplifier according to claim 5, further comprising an electrostatic discharge protection circuit coupled to the first input of the first high voltage amplifier.

14. The current sensing amplifier according to claim 5, wherein the first amplifier input is a non-inverting input and the second amplifier input is an inverting input.

* * * * *